US011387198B2

(12) United States Patent
Gomes et al.

(10) Patent No.: US 11,387,198 B2
(45) Date of Patent: Jul. 12, 2022

(54) DEVICE, SYSTEM AND METHOD FOR PROVIDING INDUCTOR STRUCTURES

(71) Applicant: Intel Corporation, Santa Clara, CA (US)

(72) Inventors: Wilfred Gomes, Portland, OR (US); Mark Bohr, Aloha, OR (US); Doug Ingerly, Portland, OR (US); Rajesh Kumar, Portland, OR (US); Harish Krishnamurthy, Hillsboro, OR (US); Nachiket Venkappayya Desai, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/635,536

(22) PCT Filed: Sep. 29, 2017

(86) PCT No.: PCT/US2017/054619
§ 371 (c)(1),
(2) Date: Jan. 30, 2020

(87) PCT Pub. No.: WO2019/066969
PCT Pub. Date: Apr. 4, 2019

(65) Prior Publication Data
US 2020/0258852 A1 Aug. 13, 2020

(51) Int. Cl.
*H01L 23/64* (2006.01)
*H01L 21/48* (2006.01)
(Continued)

(52) U.S. Cl.
CPC ........ *H01L 23/645* (2013.01); *H01L 21/4853* (2013.01); *H01L 21/565* (2013.01);
(Continued)

(58) Field of Classification Search
None
See application file for complete search history.

(56) References Cited

U.S. PATENT DOCUMENTS 9,013,892 B2 4/2015 Liu et al.
2004/0222506 A1* 11/2004 Wei ........................ H01L 23/645
257/686

(Continued)

OTHER PUBLICATIONS

International Search Report and Written Opinion for International Patent Application No. PCT/US2017/054619 dated Jun. 28, 2018, 13 pgs.
Search Report from European Patent Application No. 17927249.7 dated Apr. 12, 2021, 9 pages.

*Primary Examiner* — Long Pham
(74) *Attorney, Agent, or Firm* — Schwabe, Williamson & Wyatt P.C.

(57) ABSTRACT

Techniques and mechanisms for providing an inductor with an integrated circuit (IC) die. In an embodiment, the IC die comprises integrated circuitry and one or more first metallization layers. The IC die is configured to couple to a circuit device including one or more second metallization layers, where such coupling results in the formation of an inductor which is coupled to the integrated circuitry. One or more loop structures of the inductor each span both some or all of the one or more first metallization layers and some or all of the one or more second metallization layers. In another embodiment, the IC die or the circuit device includes a ferromagnetic material to concentrate a magnetic flux which is provided with the inductor.

15 Claims, 7 Drawing Sheets

(51) Int. Cl.
*H01L 21/56* (2006.01)
*H01L 23/498* (2006.01)
*H01L 23/00* (2006.01)
*H01L 25/065* (2006.01)
*H01L 25/00* (2006.01)

(52) U.S. Cl.
CPC ........ *H01L 23/49838* (2013.01); *H01L 24/16* (2013.01); *H01L 25/0657* (2013.01); *H01L 25/50* (2013.01); H01L 2224/16145 (2013.01); H01L 2224/16227 (2013.01); H01L 2225/06513 (2013.01); H01L 2225/06531 (2013.01); H01L 2225/06558 (2013.01); H01L 2225/06582 (2013.01); H01L 2924/19042 (2013.01)

(56) References Cited

U.S. PATENT DOCUMENTS

| | | |
|---|---|---|
| 2009/0085704 A1 | 4/2009 | Theuss |
| 2009/0091414 A1 | 4/2009 | Hopper et al. |
| 2010/0197045 A1 | 8/2010 | Koduri |
| 2013/0307117 A1 | 11/2013 | Koduri |
| 2015/0235952 A1* | 8/2015 | Pan .................... H01L 23/5384 361/782 |
| 2015/0255531 A1* | 9/2015 | Yen ........................ H01L 28/10 257/531 |
| 2015/0364418 A1 | 12/2015 | Leong et al. |
| 2017/0178791 A1 | 6/2017 | Pornin |
| 2019/0067253 A1* | 2/2019 | Nakano ............... H01L 25/0652 |

\* cited by examiner

DEVICE, SYSTEM AND METHOD FOR PROVIDING INDUCTOR STRUCTURES

CROSS-REFERENCE TO RELATED APPLICATION

This patent application is a U.S. National Phase Application under 35 U.S.C. § 371 of International Application No. PCT/US2017/054619, filed Sep. 29, 2017, entitled "DEVICE, SYSTEM AND METHOD FOR PROVIDING INDUCTOR STRUCTURES," which designates the United States of America, the entire disclosure of which is hereby incorporated by reference in its entirety and for all purposes.

TECHNICAL FIELD

Embodiments of the invention relate generally to integrated circuit devices and more particularly, but not exclusively, to an IC die arranged in a stacked configuration with a circuit device to form an inductor.

BACKGROUND

Integrated circuit (IC) dies typically contain various circuits that require precisely controlled voltage and/or current. In some cases, the power supplied to such circuits is controlled with an external voltage regulator. In order to save space, part of the power supply is often integrated onto the circuitry in the die. On-die voltage regulation can also be used to throttle voltage in real time and thereby provide active power management.

Often, some components for a power supply are not formed on the integrated circuit die. Passive components, such as inductors, transformers, and capacitors have traditionally been difficult to form in the same process that is used to make transistors or have been too large to place on the die. Components formed outside of the die have more room and can be made to higher quality at less cost. For on-die voltage regulators, inductors are sometimes mounted to a package substrate.

As successive generations of semiconductor fabrication and packaging continue to trend toward smaller scales and higher circuit integration, there is expected to be an increasing demand placed on incremental improvements to the implementation of inductors for operation with on-die circuitry.

BRIEF DESCRIPTION OF THE DRAWINGS

The various embodiments of the present invention are illustrated by way of example, and not by way of limitation, in the figures of the accompanying drawings and in which.

DETAILED DESCRIPTION

Embodiments described herein variously provide inductance structures which span multiple circuit devices including at least one IC die. The inductor may include at least one loop which spans both one or more metallization layers of the IC die and one or more metallization layers of a circuit device coupled thereto. Loop structures of the inductor may be larger (e.g., having a greater z-dimension height), as compared to those provided by various conventional techniques.

The technologies described herein may be implemented in one or more electronic devices. Non-limiting examples of electronic devices that may utilize the technologies described herein include any kind of mobile device and/or stationary device, such as cameras, cell phones, computer terminals, desktop computers, electronic readers, facsimile machines, kiosks, laptop computer, netbook computers, notebook computers, internet devices, payment terminals, personal digital assistants, media players and/or recorders, servers (e.g., blade server, rack mount server, combinations thereof, etc.), set-top boxes, smart phones, tablet personal computers, ultra-mobile personal computers, wired telephones, combinations thereof, and the like. More generally, the technologies described herein may be employed in any of a variety of electronic devices including an IC die and one or more metallization layers coupled thereto.

Figure 1:
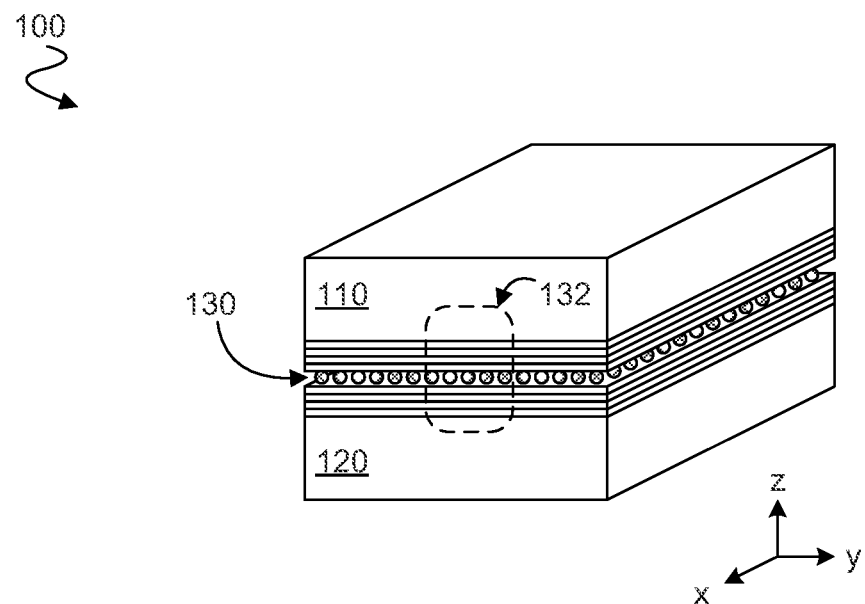
FIG. 1 shows a perspective view and a cross-sectional view a system including inductor structures according to an embodiment.
Figure 1:
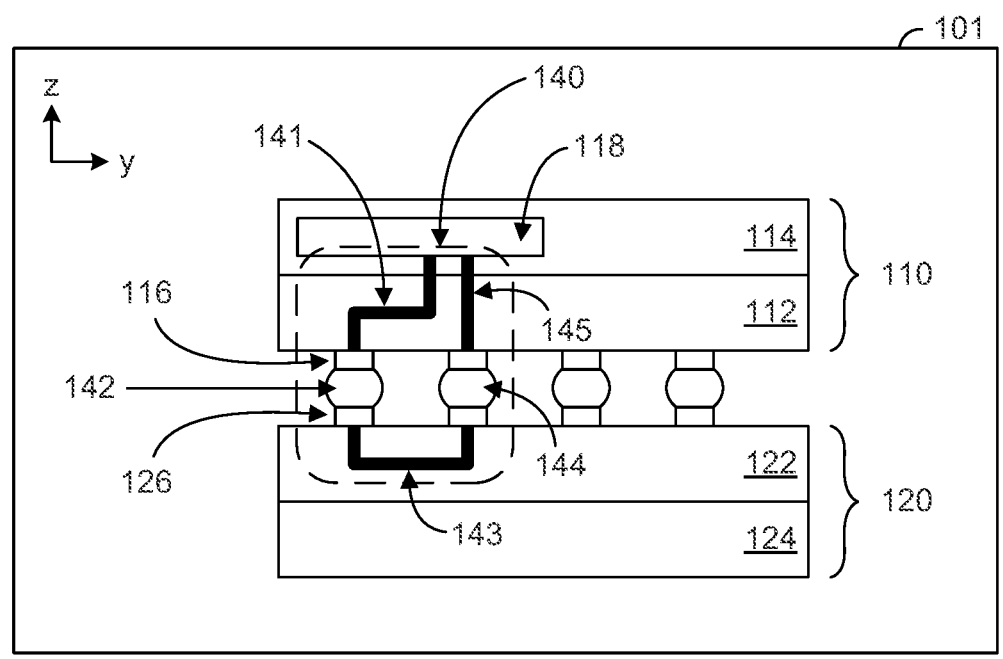

FIG. 1 shows features of a system 100 to provide an inductor for operation with integrated circuitry according to an embodiment. System 100 is one example of an embodiment wherein an integrated circuit (IC) die is coupled to a circuit device, where such coupling forms an inductor which spans both one or more metallization layers of the IC die and one or more other metallization layers of the circuit device. Although some embodiments are not limited in this regard, system 100 may include, or be configured to provide, some or all of any of a variety of packaged devices—e.g., wherein system 100 further comprises a mold compound (not shown) disposed over one or both of the IC die and the circuit device. Other embodiments are provided (for example) by only the IC die or, alternatively, by only the circuit device which is to couple to the IC die.

As shown in FIG. 1, system 100 may include IC die 110 and a circuit device 120 coupled thereto. IC die 110 represents any of a variety of devices comprising a semiconductor substrate, integrated circuitry variously disposed in or on said semiconductor substrate, and one or more layers of patterned conductive material, the one or more layers configured to enable coupling of the integrated circuitry to structures which are external to IC die 110.

Circuit device 120 represents any of a variety of devices that include one or more metallization layers configured to provide respective portions of one or more loop structures of an inductor. In the example embodiment shown, circuit device 120 is another IC die. For example, circuit device 200 may include interconnect structures variously formed in or on a semiconductor substrate. However, in other embodiments, circuit device 120 may include an interposer or a package substrate, for example. IC die 110 and circuit device 120 may be coupled to one another via a hardware interface 130 which, for example, includes solder joints and/or other conductive contacts variously disposed between respective contacts of IC die 110 and circuit device 120. FIG. 1 further shows a cross-sectional detail view 101 of a region of system 100 (such as region 132 shown) which includes a portion of hardware interface 130.

As illustrated in detail view 101, contacts 116 may be disposed in or on a side of IC die 110, where other contacts 126 are disposed in or on a side of circuit device 120. Contacts 116, 126 may include any of a variety of conductive structures (e.g., pads comprising copper, gold, aluminum and/or the like) which, for example, are adapted from conventional techniques for coupling with an IC die. In such an embodiment, hardware interface 130 may comprise interconnect structures (e.g., including the illustrative microbumps 142, 144 shown) which are each coupled between a respective one of contacts 116 and a respective one of contacts 126. Some or all of microbumps 142, 144 may comprise a solder including, for example, nickel (Ni), tin (Sn), silver (Ag) and/or the like.

Coupling of IC die 110 and circuit device 120 to one another may result in the formation of an inductor (such as the illustrative inductor 140 shown) that is coupled to circuitry of IC die 110. By way of illustration and not limitation, IC die 110 may comprise one or more metallization layers 112 and a device layer 114 including integrated circuitry 118. Integrated circuitry 118 may include, for example, active circuit elements (e.g., CMOS and/or other transistors) configured to provide functionality of a bridge circuit, power delivery circuit, voltage regulator circuit and/or any of various other components. However, some embodiments are not limited to the particular circuit functionality that might be provided with integrated circuitry 118.

Device layer 114 may be disposed on, or integrated with, a semiconductor substrate (not shown) of IC die 110—e.g., wherein the semiconductor substrate and one or more metallization layers 112 are on opposite respective sides of circuitry 118. In an embodiment, circuit device 120 further comprises one or more metallization layers 122. Some or all of the metallization layers 112, 122 may be provided by fabrication processes—e.g., including mask, etch, deposition (e.g., plating, sputtering and/or the like) and/or other operations—that, for example, are adapted from conventional semiconductor fabrication techniques.

In the example embodiment illustrated in view 101, one or more metallization layers 112 includes conductors 141, 145—e.g., comprising copper, silver, gold, aluminum and/or the like—each coupled between integrated circuitry 118 and a respective one of contacts 116. One or more metallization layers 122 may include at least one conductor (such as the illustrative conductor 143 shown) which extends between, and couples directly to, a respective two of contacts 118. In such an embodiment, inductor 140 includes at least one loop, portions of which are formed at least in part by conductors 141, 143, 145.

Although some embodiments, are not limited in this regard, inductor 140 may further comprise one or more additional loops (not shown) which variously span some or all of metallization layers 112, 122. For example, one or more metallization layers 112 may further comprise one or more additional conductors (not shown) which each extend between a respective two others of contacts 116, where one or more metallization layers 122 further comprise one or more additional conductors which each extend between a respective two others of contacts 118. Such additional conductors may be variously coupled to form one or more loops which are coupled between conductors 141, 145.

By enabling the formation of a loop portion which extends at least in part into circuit device 120, some embodiments variously provide an increased height of inductor 140 (e.g., along the z-dimension of the xyz coordinate system shown), as compared to conventional techniques. Although some embodiments are not limited in this regard, circuit device 120 may further comprise one or more other layers 114—e.g., including a device layer, a semiconductor substrate layer and/or the like—which, for example, facilitate coupling of circuit device 120 to additional circuitry (not shown) which is included in, or to be coupled to, system 100. Alternatively or in addition, IC die 110 or circuit device 120 may have formed therein one or more ferromagnetic materials (not shown) to concentrate magnetic flux and/or otherwise shape a magnetic field generated with inductor 140.

Figure 2:
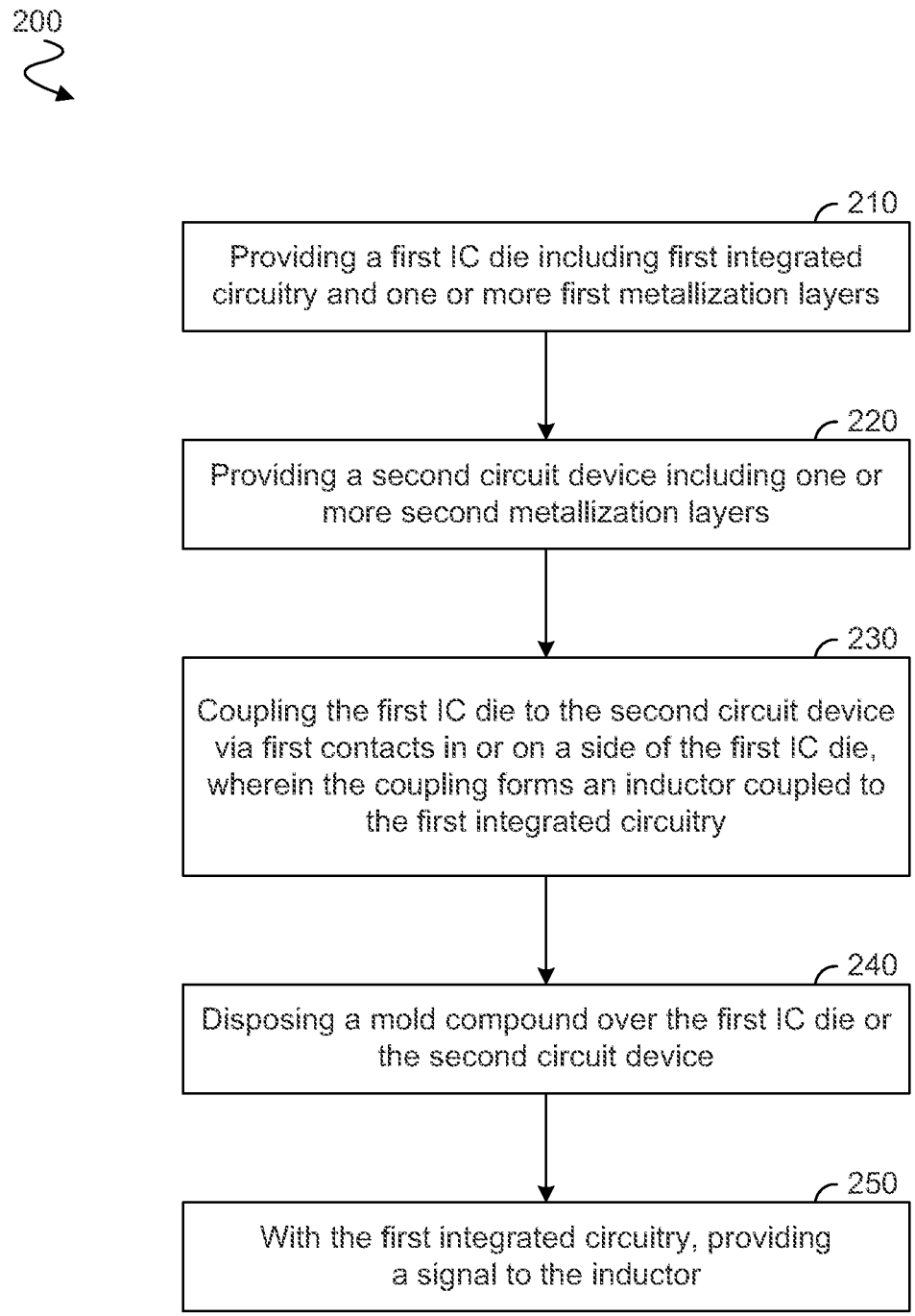
FIG. 2 is a flow diagram illustrating elements of a method to provide inductor structures with an integrated circuit die according to an embodiment.

FIG. 2 shows features of a method 200 to provide an inductor with an IC die according to an embodiment. Method 200 is one example of an embodiment that provides functionality such as that of system 100—e.g., where operations of method 200 fabricate, connect and/or operate structures of IC die 110 and/or structures of IC die 120, for example.

As shown in FIG. 2, method 200 may include, at 210, providing a first integrated circuit (IC) die—e.g., IC die 110—including first integrated circuitry and one or more first metallization layers. The first integrated circuitry may include a bridge circuit, a voltage regulator or any of various other power delivery circuits, for example. The one or more first metallization layers may have formed therein multiple conductors to form at least in part one or more loop portions of an inductor. For example, the one or more first metallization layers may include at least two conductors, such as conductors 141, 145, which are each coupled between the first integrated circuitry and a respective conductive contact (e.g., one of contacts 116) formed in or on a side of the IC die. In some embodiments, the one or more first metallization layers further include one or more additional conductors which are each coupled between a respective other two of said conductive contacts.

Method 200 may further comprise, at 220, providing a second circuit device—such as circuit device 120 of system 100—which includes one or more second metallization layers. The second circuit device may be a second IC die (e.g., comprising a semiconductor substrate and a device layer). In other embodiments, the second circuit device includes a package substrate or an interposer. The one or more second metallization layers may have formed therein one or more conductors each to form at least in part a respective loop portion of the inductor. For example, the one or more second metallization layers may include at least one conductor, such as conductor 143, which is coupled between a respective to conductive contacts (e.g., two of contacts 118) formed in or on a side of the circuit device.

In an embodiment, method 200 further comprises, at 230, coupling the first IC die to the second circuit device via first contacts disposed in or on a side of the first IC die (e.g., in or on a side of the first metallization layers). The coupling at 230 may form an inductor coupled to the first integrated circuitry—e.g., wherein one or more loop structures of the inductor each include a respective first conductor portion of the one or more first metallization layers and a respective second conductor portion of the one or more second metallization layers of the second circuit device. For example, the inductor may include multiple loops each spanning a respective portion of the one or more first metallization layers and a respective portion of the one or more second metallization layers.

Although some embodiments are not limited in this regard, method 200 may include one or more additional fabrication processes to couple the first IC device and the second circuit device to other circuitry, or to facilitate such coupling to other circuitry. For example, method 200 may further comprise, at 240, disposing a mold compound over the first IC die or the second circuit device—e.g., where such disposing is to form at least in part a packaged device including the first IC die and the second circuit device. The disposing at 240 may include one or more operations adapted from conventional circuit packaging techniques. A package including the first IC die and second circuit device may further include, for example, one or more other IC dies, one or more discrete circuit components, an interposer, a package substrate, interface structures (e.g., a ball grid array) and/or the like.

In some embodiments, method 200 additionally or alternatively includes operating circuitry which includes the inductor formed by the coupling at 230. For example, method 200 may include, at 250, providing an input signal to the inductor with the first integrated circuitry. Another signal or voltage (e.g., including a supply voltage or a reference voltage), may be received by or output from the first IC die, where the other signal or voltage is based on—or alternatively, results in—the input signal provided to the inductor at 250.

Figure 3:
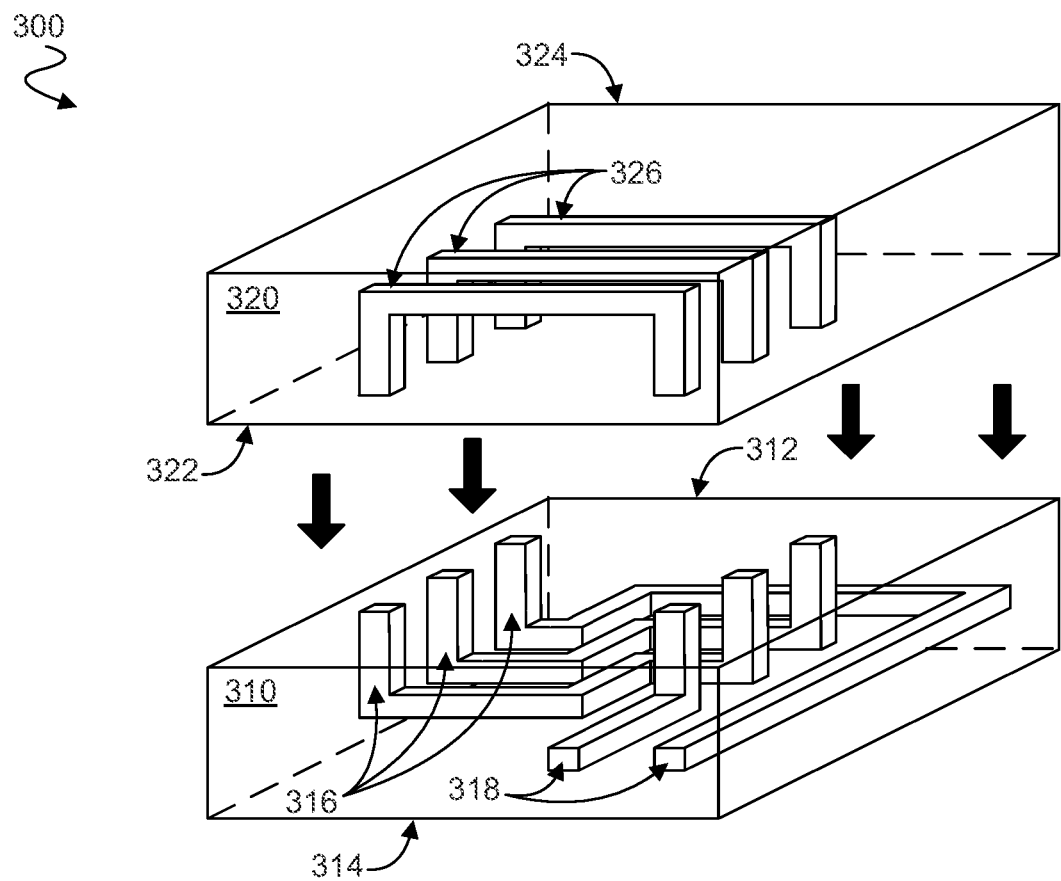
FIG. 3 shows perspective views of inductor structures of an integrated circuit die according to an embodiment.
Figure 3:
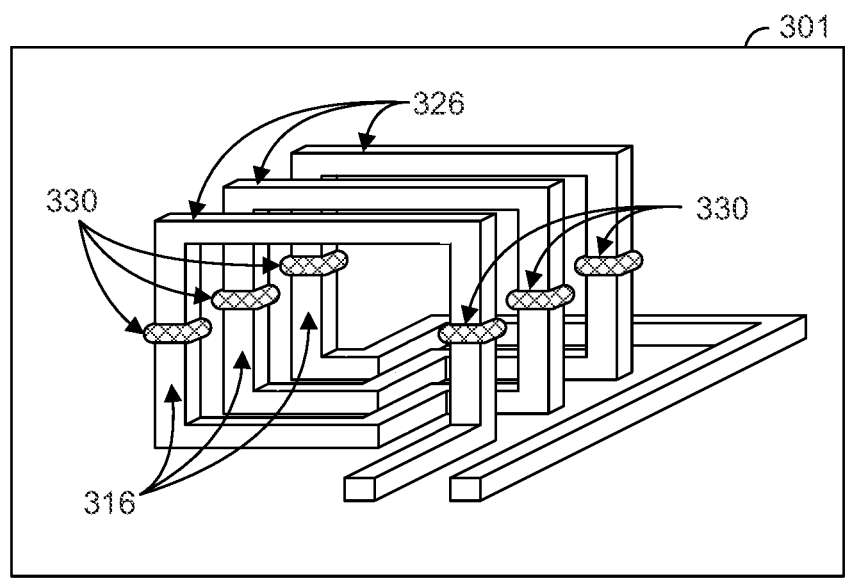

FIG. 3 shows, in an assembly view, features of a system 300 to provide an inductor according to an embodiment. System 300 is one example of an embodiment wherein an IC die and another circuit device, coupled thereto, form multiple loops of an inductor, wherein the multiple loops each span both a respective part of the IC die and a respective part of the other circuit device. System 300 may include features of system 100—e.g., wherein fabrication and/or operation of system 300 includes one or more operations of method 200.

In the example embodiment shown, system 300 includes an IC die 310 and a circuit device 320 coupled thereto—where circuit device 320 is another IC die, a package substrate or an interposer. Metallization layers of IC die 310 may have formed therein two conductors 318 to couple the inductor to integrated circuitry (not shown) of IC die 310. In some embodiments, the metallization layers of IC die 310 further form one or more conductive loop portions 316 which are each to form at least in part a respective loop of the inductor. Conductors 318 and conductive loop portions 316 may variously include or couple to respective contacts at a side 312 of IC die 310 (e.g., where conductors 318 and conductive loop portions 316 variously extend from side 312 at least partially toward an opposite side 314 of IC die 310).

Metallization layers of circuit device 320 may have formed therein multiple conductive loop portions 326 which are each to form at least in part a respective loop of the inductor. Conductive loop portions 326 may variously include or couple to respective contacts at a side 322 of circuit device 320 (e.g., where conductive loop portions 326 variously extend from side 322 at least partially toward an opposite side 324 of circuit device 320). The respective sides 312, 322 of IC die 310 and circuit device 320 may be coupled to one another to form an inductor including conductive loop portions 326, 328.

For example, FIG. 3 further shows an assembled view 301 of system 300, wherein microbumps 330 variously couple respective terminal ends of conductive loop portions 326 each with an opposite terminal end of a respective one of conductive loop portions 328. In the example embodiment shown in view 301, the inductor formed includes at least three loops which span respective metallization layers of IC die 310 and circuit device 320. However, the inductor may include more, fewer and/or differently configured loop structures, in various embodiments. Insulator structures of system 300 are not shown in detail view 301 to avoid obscuring features of the inductor which is formed at least in part with conductive loop portions 326, 328 and with microbumps 330.

Figure 4:
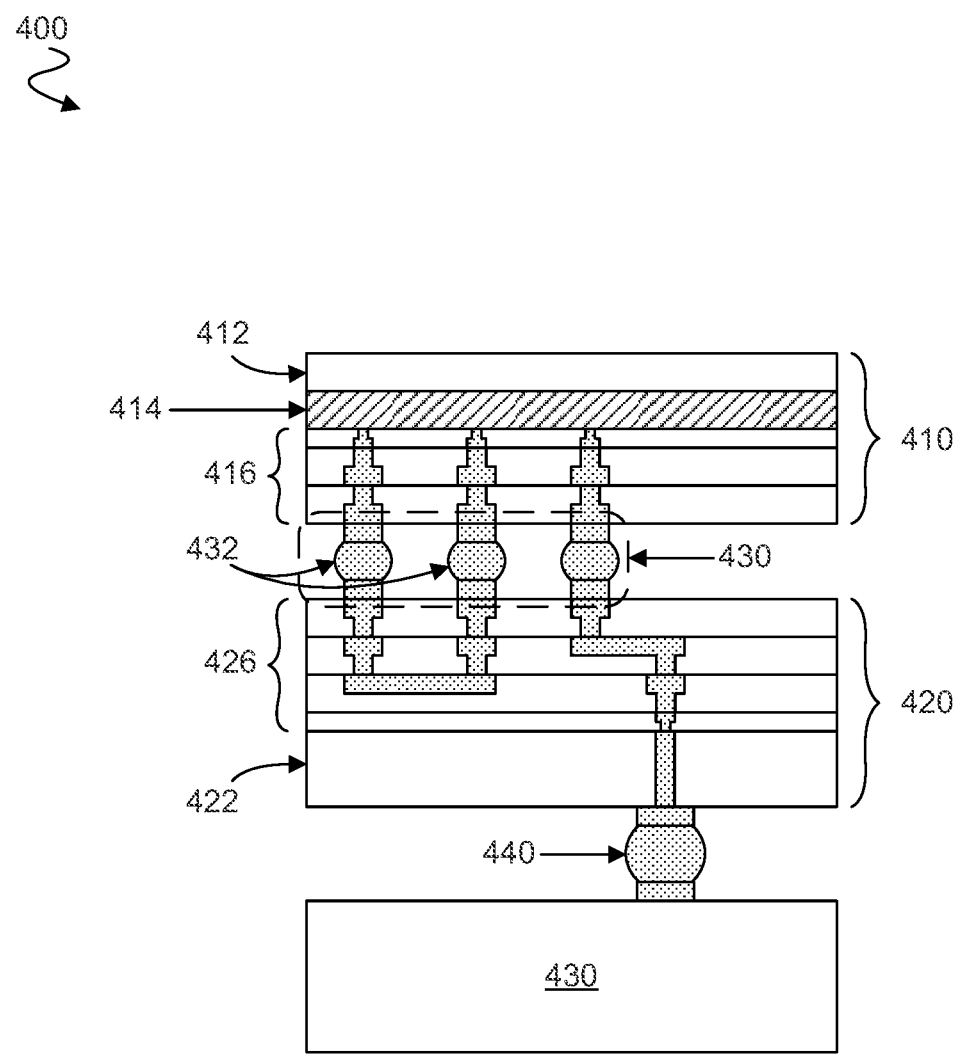
FIG. 4 shows a system including on-die features to provide structures of an inductor according to an embodiment.

Referring now to FIG. 4, a system 400 according to one example embodiment may provide an inductor coupled to circuitry of an IC die. System 400 may include features of one of systems 100, 300—e.g., wherein fabrication and/or operation of system 400 includes one or more operations of method 200.

In the example embodiment shown, system 400 includes an IC die 410 and a circuit device 420 coupled thereto—where circuit device 420 is another IC die (or alternatively, a package substrate or an interposer). IC die 410 may include a semiconductor substrate 412, a device layer 414 comprising integrated circuitry disposed in or on semiconductor substrate 412, and metallization layers 416 disposed on device layer 414. Similarly, circuit device 420 may include a semiconductor substrate 422 and metallization layers 426 disposed on semiconductor substrate 422.

A hardware interface 430 of system 400 may include microbumps 432 coupling contact pads of IC die 410 each to a respective contact pad of circuit device 420. An inductor, formed by the coupling of IC die 410 to circuit device 420, may include conductors of metallization layers 416, two or more of microbumps 432, and one or more conductors of metallization layers 426. Integrated circuitry of device layer 414 may be coupled to provide an input signal to the inductor (and/or to receive an output signal from the inductor). In some embodiments, such integrated circuitry may be further coupled to communicate with other circuitry which is external to IC die 410 (and in some embodiments, external to system 400). By way of illustration and not limitation, device layer 414 may be further coupled, via circuit device 420 and one or more solder bumps 440, to another device 430 such as a package substrate or a printed circuit board. Communication between device layer 414 and device 430 may include communication of a voltage or signal which is based on (or alternatively, which results in) a signal which is provided to the inductor formed at least in part by metallization layers 416, 418.

Figure 5:
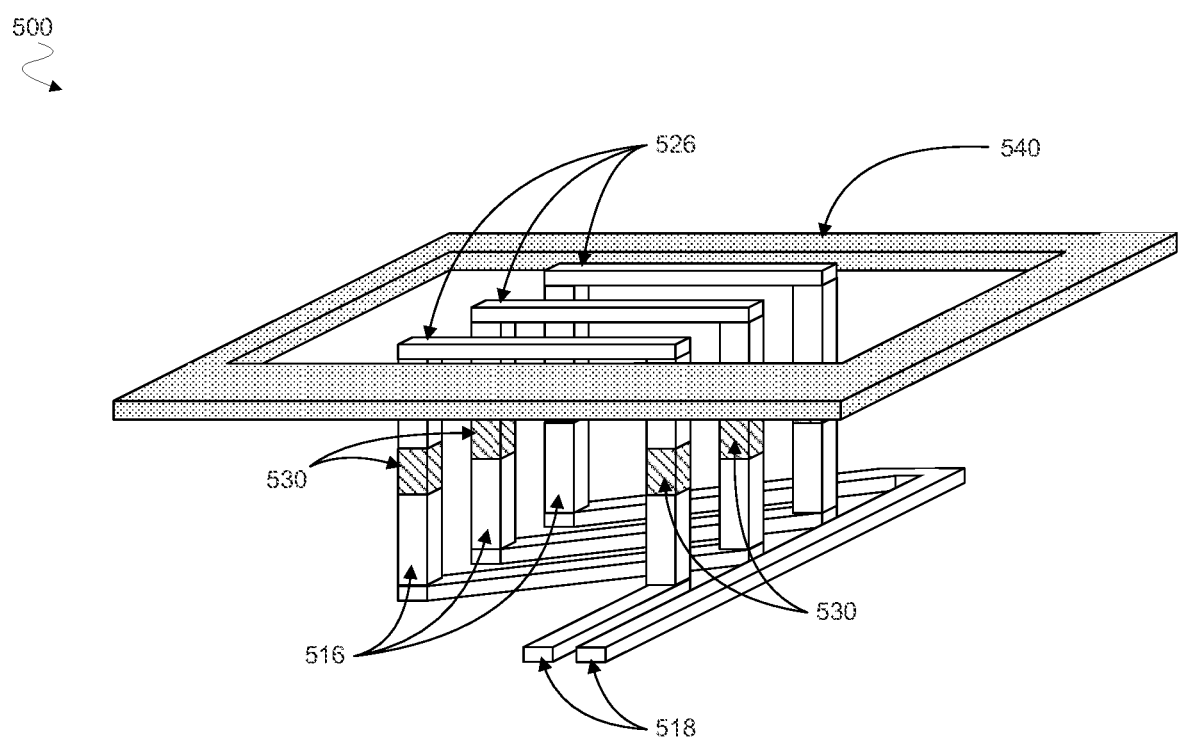
FIG. 5 shows a system including on-die features to provide structures of an inductor according to an embodiment.

FIG. 5 shows a system 500, according to an embodiment, wherein an IC die and another circuit device, coupled thereto, form multiple loops of an inductor, wherein the multiple loops each span both a respective part of the IC die and a respective part of the other circuit device. System 500 may include features of one of systems 100, 300, 400—e.g., wherein fabrication and/or operation of system 500 includes one or more operations of method 200.

To avoid obscuring certain features of various embodiments, system 500 is shown as having some features similar to those of system 300. By way of illustration and not limitation, system 500 may include conductive loop portions 516 and conductors 518 of the IC die, conductive loop portions 526 of the circuit device, and microbumps 530 coupled between the IC die and the circuit device. Conductive loop portions 516, conductive loop portions 526, conductors 518 and microbumps 530 may, for example, provide functionality corresponding to that of conductive loop portions 316, conductive loop portions 326, conductors 318 and microbumps 330, respectively.

To provide improved inductance and/or magnetic permeability characteristics of system 500, some embodiments further comprise a ferromagnetic material which is disposed in, on or around one of the IC die and the circuit device. By way of illustration and not limitation, a ferrous ring 540 may comprise a barium ferrite (BaFe) compound, a strontium ferrite compound, a rare earth material—e.g., neodymium iron boron (NdFeB) or a samarium cobalt compound (e.g., $Sm_2Co_{17}$)—may be disposed in metallization layers of system 500. The ferromagnetic material may form a ring, column or any of various other structures which are configured to concentrate or otherwise shape flux of a magnetic field which is formed with the inductor.

Figure 6:
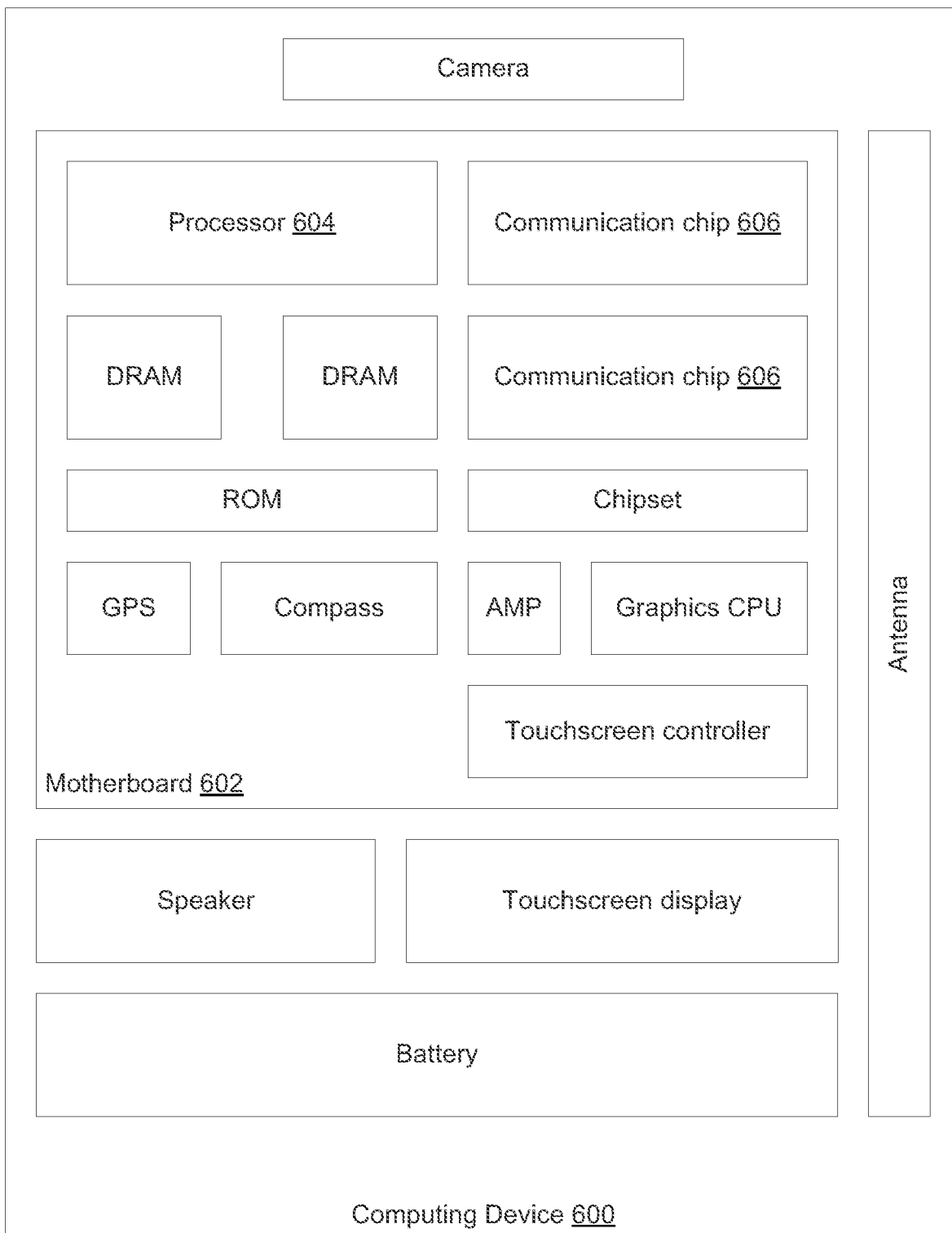
FIG. 6 is a functional block diagram illustrating elements of a computing device in accordance with one embodiment.

FIG. 6 illustrates a computing device 600 in accordance with one embodiment. The computing device 600 houses a board 602—e.g., where an IC die and a circuit device, each coupled to board 602, together form an inductor. The board 602 may include a number of components, including but not limited to a processor 604 and at least one communication chip 606. The processor 604 is physically and electrically coupled to the board 602. In some implementations the at least one communication chip 606 is also physically and electrically coupled to the board 602. In further implementations, the communication chip 606 is part of the processor 604.

Depending on its applications, computing device 600 may include other components that may or may not be physically and electrically coupled to the board 602. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 606 enables wireless communications for the transfer of data to and from the computing device 600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 606 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 600 may include a plurality of communication chips 606. For instance, a first communication chip 606 may be dedicated to shorter range wireless communications such as Wi-Fi and Bluetooth and a second communication chip 606 may be dedicated to longer range wireless communications such as GPS, EDGE, GPRS, CDMA, WiMAX, LTE, Ev-DO, and others.

The processor 604 of the computing device 600 includes an integrated circuit die packaged within the processor 604. The term "processor" may refer to any device or portion of a device that processes electronic data from registers and/or memory to transform that electronic data into other electronic data that may be stored in registers and/or memory. The communication chip 606 also includes an integrated circuit die packaged within the communication chip 606.

In various implementations, the computing device 600 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 600 may be any other electronic device that processes data.

Some embodiments may be provided as a computer program product, or software, that may include a machine-readable medium having stored thereon instructions, which may be used to program a computer system (or other electronic devices) to perform a process according to an embodiment. A machine-readable medium includes any mechanism for storing or transmitting information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices, etc.), a machine (e.g., computer) readable transmission medium (electrical, optical, acoustical or other form of propagated signals (e.g., infrared signals, digital signals, etc.)), etc.

Figure 7:
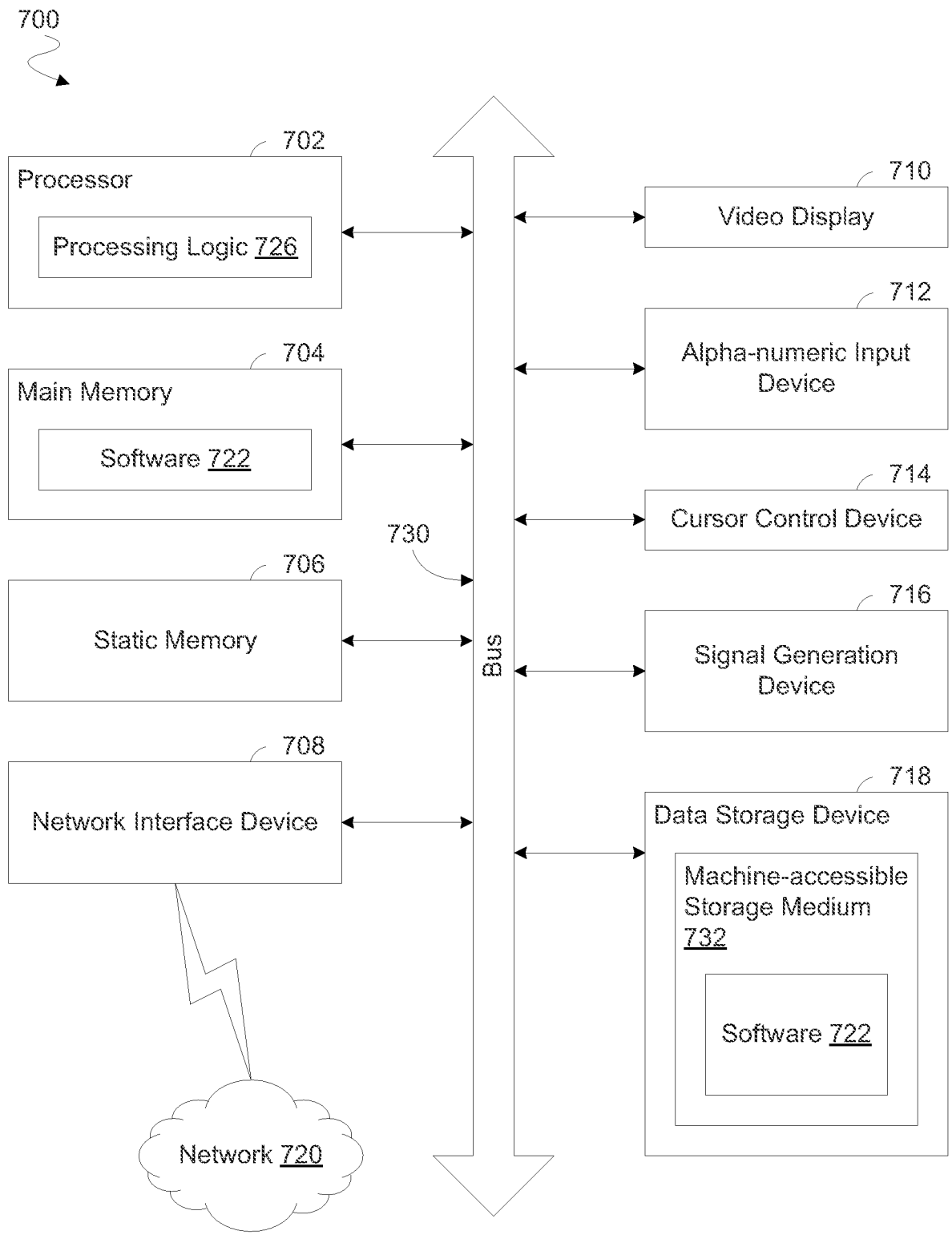
FIG. 7 is a functional block diagram illustrating elements of an exemplary computer system, in accordance with an embodiment.

FIG. 7 illustrates a diagrammatic representation of a machine in the exemplary form of a computer system 700 within which a set of instructions, for causing the machine to perform any one or more of the methodologies described herein, may be executed. In alternative embodiments, the machine may be connected (e.g., networked) to other machines in a Local Area Network (LAN), an intranet, an extranet, or the Internet. The machine may operate in the capacity of a server or a client machine in a client-server network environment, or as a peer machine in a peer-to-peer (or distributed) network environment. The machine may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated, the term "machine" shall also be taken to include any collection of machines (e.g., computers) that individually or jointly execute a set (or multiple sets) of instructions to perform any one or more of the methodologies described herein.

The exemplary computer system 700 includes a processor 702, a main memory 704 (e.g., read-only memory (ROM), flash memory, dynamic random access memory (DRAM) such as synchronous DRAM (SDRAM) or Rambus DRAM (RDRAM), etc.), a static memory 706 (e.g., flash memory, static random access memory (SRAM), etc.), and a secondary memory 718 (e.g., a data storage device), which communicate with each other via a bus 730.

Processor 702 represents one or more general-purpose processing devices such as a microprocessor, central processing unit, or the like. More particularly, the processor 702 may be a complex instruction set computing (CISC) microprocessor, reduced instruction set computing (RISC) microprocessor, very long instruction word (VLIW) microprocessor, processor implementing other instruction sets, or processors implementing a combination of instruction sets. Processor 702 may also be one or more special-purpose processing devices such as an application specific integrated circuit (ASIC), a field programmable gate array (FPGA), a digital signal processor (DSP), network processor, or the like. Processor 702 is configured to execute the processing logic 726 for performing the operations described herein.

The computer system 700 may further include a network interface device 708. The computer system 700 also may include a video display unit 710 (e.g., a liquid crystal display (LCD), a light emitting diode display (LED), or a cathode ray tube (CRT)), an alphanumeric input device 712 (e.g., a keyboard), a cursor control device 714 (e.g., a mouse), and a signal generation device 716 (e.g., a speaker).

The secondary memory 718 may include a machine-accessible storage medium (or more specifically a computer-readable storage medium) 732 on which is stored one or more sets of instructions (e.g., software 722) embodying any one or more of the methodologies or functions described herein. The software 722 may also reside, completely or at least partially, within the main memory 704 and/or within the processor 702 during execution thereof by the computer system 700, the main memory 704 and the processor 702 also constituting machine-readable storage media. The software 722 may further be transmitted or received over a network 720 via the network interface device 708.

While the machine-accessible storage medium 732 is shown in an exemplary embodiment to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any of one or more embodiments. The term "machine-readable storage medium" shall accordingly be taken to include, but not be limited to, solid-state memories, and optical and magnetic media.

In one implementation, a system comprises a first integrated circuit (IC) die including first integrated circuitry and one or more first metallization layers coupled between the first integrated circuitry and a hardware interface. The system further comprises a second circuit device coupled to the first IC die, the second circuit device including one or more second metallization layers coupled to the one or more first metallization layers via the hardware interface, wherein the system includes an inductor coupled to the first integrated circuitry, wherein one or more loop structures of the inductor each include a respective first conductor portion of the one or more first metallization layers, and a respective second conductor portion of one or more second metallization layers of the second circuit device, the respective second conductor portion coupled to the first conductor portion.

In one embodiment, the second circuit device is a second IC die comprising a semiconductor substrate and a device layer. In another embodiment, the second circuit device is a package substrate. In another embodiment, the second circuit device is an interposer. In another embodiment, the inductor includes multiple loop structures each spanning a respective portion of the one or more first metallization layers and a respective portion of the one or more second metallization layers. In another embodiment, the first IC die or the second circuit device further comprises a ferromagnetic structure configured to shape a magnetic field generated with the inductor. In another embodiment, the ferromagnetic structure includes a ferromagnetic ring. In another embodiment, the first integrated circuitry includes a bridge circuit. In another embodiment, the first integrated circuitry includes a voltage regulator circuit.

In another implementation, a method comprises providing a first integrated circuit (IC) die including first integrated circuitry and one or more first metallization layers, and coupling the first IC die to a second circuit device via first contacts in or on a side of the IC die, wherein the coupling forms an inductor coupled to the first integrated circuitry, wherein one or more loop structures of the inductor each include a respective first conductor portion of the one or more first metallization layers, and a respective second conductor portion of one or more second metallization layers of the second circuit device, the respective second conductor portion coupled to the first conductor portion.

In one embodiment, the method further comprises disposing a mold compound over the first IC die or the second circuit device. In another embodiment, the method further comprises sending a first signal from the first integrated to the inductor, and sending at the first integrated a second signal from the inductor, the second signal based on the first signal. In another embodiment, the second circuit device is a second IC die comprising a semiconductor substrate and a device layer. In another embodiment, the second circuit device is a package substrate. In another embodiment, the second circuit device is an interposer. In another embodiment, the inductor includes multiple loop structures each spanning a respective portion of the one or more first metallization layers and a respective portion of the one or more second metallization layers. In another embodiment, the first IC die or the second circuit device further comprises a ferromagnetic structure configured to shape a magnetic field generated with the inductor. In another embodiment, the ferromagnetic structure includes a ferromagnetic ring. In another embodiment, the first integrated circuitry includes a bridge circuit. In another embodiment, the first integrated circuitry includes a voltage regulator circuit.

In another implementation, an integrated circuit (IC) die comprises first integrated circuitry, and one or more first metallization layers, wherein the IC die is configured to couple to a second circuit device, via first contacts in or on a side of the IC die, to form with the second circuit device an inductor coupled to the first integrated circuitry, wherein one or more loop structures of the inductor are to each include a respective first conductor portion of the one or more first metallization layers, and a respective second conductor portion of one or more second metallization layers of the second circuit device, the respective second conductor portion coupled to the first conductor portion.

In one embodiment, wherein the inductor to include multiple loop structures which each span a respective portion of the one or more first metallization layers and a respective portion of the one or more second metallization layers. In another embodiment, the IC die further comprises a ferromagnetic structure configured to shape a magnetic field generated with the inductor. In another embodiment, the ferromagnetic structure includes a ferromagnetic ring. In another embodiment, the first integrated circuitry includes a bridge circuit. In another embodiment, the first integrated circuitry includes a voltage regulator circuit.

Techniques and architectures for providing structures of an inductor are described herein. In the above description, for purposes of explanation, numerous specific details are set forth in order to provide a thorough understanding of certain embodiments. It will be apparent, however, to one skilled in the art that certain embodiments can be practiced without these specific details. In other instances, structures and devices are shown in block diagram form in order to avoid obscuring the description.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

Some portions of the detailed description herein are presented in terms of algorithms and symbolic representations of operations on data bits within a computer memory. These algorithmic descriptions and representations are the means used by those skilled in the computing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the discussion herein, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Certain embodiments also relate to apparatus for performing the operations herein. This apparatus may be specially constructed for the required purposes, or it may comprise a general purpose computer selectively activated or reconfigured by a computer program stored in the computer. Such a computer program may be stored in a computer readable storage medium, such as, but is not limited to, any type of disk including floppy disks, optical disks, CD-ROMs, and magnetic-optical disks, read-only memories (ROMs), random access memories (RAMs) such as dynamic RAM (DRAM), EPROMs, EEPROMs, magnetic or optical cards, or any type of media suitable for storing electronic instructions, and coupled to a computer system bus.

The algorithms and displays presented herein are not inherently related to any particular computer or other apparatus. Various general purpose systems may be used with programs in accordance with the teachings herein, or it may prove convenient to construct more specialized apparatus to perform the required method steps. The required structure for a variety of these systems will appear from the description herein. In addition, certain embodiments are not described with reference to any particular programming language. It will be appreciated that a variety of programming languages may be used to implement the teachings of such embodiments as described herein.

Besides what is described herein, various modifications may be made to the disclosed embodiments and implementations thereof without departing from their scope. Therefore, the illustrations and examples herein should be construed in an illustrative, and not a restrictive sense. The scope of the invention should be measured solely by reference to the claims that follow.

What is claimed is:

1. A system comprising:
    a first integrated circuit (IC) die including:
        a semiconductor substrate and first integrated circuitry; and
        one or more first metallization layers coupled between the first integrated circuitry and a hardware interface; and
    a second circuit device coupled to the first IC die, the second circuit device including one or more second metallization layers coupled to the one or more first metallization layers via the hardware interface;
    wherein the system includes an inductor coupled to the first integrated circuitry, wherein one or more loop structures of the inductor each include:
        a respective first conductor portion of the one or more first metallization layers; and
        a respective second conductor portion of one or more second metallization layers of the second circuit device, the respective second conductor portion coupled to the first conductor portion.

2. The system of claim 1, wherein the second circuit device is a second IC die comprising a semiconductor substrate and a device layer.

3. The system of claim 1, wherein the second circuit device is a package substrate.

4. The system of claim 1, wherein the second circuit device is an interposer.

5. The system of claim 1, wherein the inductor includes multiple loop structures each spanning a respective portion of the one or more first metallization layers and a respective portion of the one or more second metallization layers.

6. The system of claim 1, wherein the first IC die or the second circuit device further comprises a ferromagnetic structure configured to shape a magnetic field generated with the inductor.

7. The system of claim 6, wherein the ferromagnetic structure includes a ferromagnetic ring.

8. The system of claim 1, wherein the first integrated circuitry includes a bridge circuit.

9. The system of claim 1, wherein the first integrated circuitry includes a voltage regulator circuit.

10. An integrated circuit (IC) die comprising:
    a semiconductor substrate and first integrated circuitry; and
    one or more first metallization layers, wherein the IC die is configured to couple to a second circuit device, via first contacts in or on a side of the IC die, to form with the second circuit device an inductor coupled to the first integrated circuitry, wherein one or more loop structures of the inductor are to each include:
        a respective first conductor portion of the one or more first metallization layers; and
        a respective second conductor portion of one or more second metallization layers of the second circuit device, the respective second conductor portion coupled to the first conductor portion.

11. The IC die of claim 10, wherein the inductor to include multiple loop structures which each span a respective portion of the one or more first metallization layers and a respective portion of the one or more second metallization layers.

12. The IC die of claim 10, further comprising a ferromagnetic structure configured to shape a magnetic field generated with the inductor.

13. The IC die of claim 12, wherein the ferromagnetic structure includes a ferromagnetic ring.

14. The IC die of claim 10, wherein the first integrated circuitry includes a bridge circuit.

15. The IC die of claim 10, wherein the first integrated circuitry includes a voltage regulator circuit.

* * * * *